United States Patent
Nakamura et al.

(10) Patent No.: US 6,517,993 B2
(45) Date of Patent: Feb. 11, 2003

(54) COPOLYMER, PHOTORESIST COMPOSITION, AND PROCESS FOR FORMING RESIST PATTERN WITH HIGH ASPECT RATIO

(75) Inventors: Tsuyoshi Nakamura; Taeko Ikegawa; Atsushi Sawano; Kousuke Doi; Hidekatsu Kohara, all of Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 25 days.

(21) Appl. No.: 09/901,646

(22) Filed: Jul. 11, 2001

(65) Prior Publication Data

US 2002/0031719 A1 Mar. 14, 2002

(30) Foreign Application Priority Data

Jul. 14, 2000 (JP) ........................................ 2000-214450

(51) Int. Cl.[7] .............................................. G03F 7/004
(52) U.S. Cl. .................... 430/270.1; 430/910; 526/271; 526/279; 526/327; 528/32; 528/306
(58) Field of Search .................. 526/271, 279, 526/319, 327; 430/270.1, 325, 910, 323; 528/32, 306

(56) References Cited

U.S. PATENT DOCUMENTS

| | | | |
|---|---|---|---|
| 5,234,793 A | | 8/1993 | Sebald et al. |
| 5,234,794 A | | 8/1993 | Sebald et al. |
| 5,250,375 A | | 10/1993 | Sebald et al. |
| 5,270,151 A | * | 12/1993 | Agostino et al. ........... 430/313 |
| 6,110,637 A | | 8/2000 | Sezi et al. |
| 6,340,553 B1 | * | 1/2002 | Oomori et al. .......... 430/270.1 |

FOREIGN PATENT DOCUMENTS

| | | | |
|---|---|---|---|
| EP | 1096319 | * | 5/2001 |
| JP | 63-17915 | * | 1/1988 |
| JP | 11-212265 | | 8/1999 |

OTHER PUBLICATIONS

Derwent Abstract of JP 63–17915, Jan. 1988.*
Sebald et al., Chemical Amplification of Resist Lines-(CARL), Microelectronic Engineering, pp. 531–534.

* cited by examiner

*Primary Examiner*—Rosemary Ashton
(74) *Attorney, Agent, or Firm*—Sughrue Mion, PLLC

(57) ABSTRACT

A novel copolymer includes a repeating unit (A) represented by, for example, Formula (I) below, and a repeating unit (B) derived from an unsaturated carboxylic anhydride. The novel copolymer is suitable for the preparation of a photoresist composition that has satisfactory transparency, high sensitivity and definition and exhibits satisfactory DOF properties in the field of photolithography using a deep UV light source. By the use of the photoresist composition, a process forms a resist pattern with a high aspect ratio.

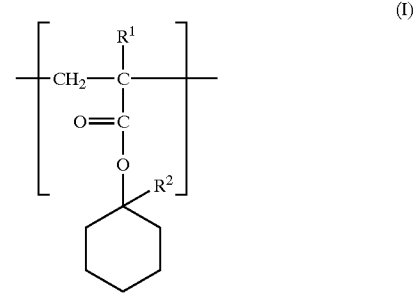

16 Claims, 2 Drawing Sheets

061302-2.PK 061302-2.SP 3601 4000.0 400.0 10.0 100.0 4.0 %T 8 3.0

REF 4000 96.5 2000 87.9 600
3856.1 92.9 3823.5 94.7 3803.8 95.1 3753.7 94.1 3746.8 94.6
3738.0 94.4 3714.2 94.6 3692.2 94.4 3678.0 92.9 3652.1 92.1
3631.3 91.6 3569.7 92.0 2945.3 50.8 2865.4 72.0 1857.5 60.5
1782.0 9.9 1718.7 41.2 1637.8 79.5 1561.0 81.2 1460.1 61.6
1450.0 61.7 1251.6 37.8 1147.2 57.3 1103.4 49.6 1091.5 50.5
998.9 69.7 926.2 45.7 842.2 39.1 763.7 79.7 696.0 77.7

CHANNEL 1
METHOD  0, 0, 4, 3

CALIBRATION OFF

| NO. NAME | RET TIME | AREA | MARK | ID# | CONC | CONC % |
|---|---|---|---|---|---|---|
| 1 | 23.3333 | 525051.2 | M | 1 1 | 525051.1875 | 100.0000 |
| TOTAL | | 525051.2 | | | 525051.1875 | 100.0000 |

CALIBRATION DATA
  3 ORDER REGRESSION $LOG\ M = a*T^3 + b*T^2 + c*T^1 + d$
  $a = -6.509859E-004$
  $b = 5.063016E-002$
  $c = 1.552977E+000$
  $d = 2.123975E+001$

PEAK TOP RT =   23.3150  :  M =    20121
   MN =    11396
   MW =    18358   MW / MN =  1.5433
   MZ =    24466   MZ / MN =  2.0567

COPOLYMER, PHOTORESIST COMPOSITION, AND PROCESS FOR FORMING RESIST PATTERN WITH HIGH ASPECT RATIO

BACKGROUND OF THE INVENTION

1. Field of the Invention

The present invention relates to a novel copolymer, to a photoresist composition and to a process for the formation of a resist pattern with a high aspect ratio. Specifically, the present invention relates to a photoresist composition that is excellent in transparency to light with wavelengths in the deep ultraviolet region (deep UV light) such as KrF or ArF laser light, and exhibits high sensitivity and definition and satisfactory depth of focus (DOF) properties, to a novel copolymer that is suitable for the preparation of the photoresist composition, and to a process for the formation of a resist pattern with a high aspect ratio.

Additionally, the present invention relates to a chemically amplified photoresist composition that is suitable for a process for the formation of a resist pattern with a high aspect ratio using a silylation agent, and to a process for the formation of a resist pattern with a high aspect ratio.

2. Description of the Related Art

To form an ultrafine resist pattern of not more than 0.35 $\mu$m, specifically of not more than 0.25 $\mu$m, a variety of highly sensitive photoresist compositions having satisfactory transparency to deep UV light such as KrF or ArF laser light have been reported.

Among them, "chemically amplified" photoresist compositions containing a substance carrying an acid-decomposable group, and a photosensitive acid generator are predominant and have been reported as follows.

Japanese Patent Laid-Open No. 5-11450 (Reference 1) discloses, as the aforementioned photoresist compositions, a photoresist composition containing a polymer and a photosensitive acid generator, which polymer comprises a (meth) acrylic tert-butyl ester group and a maleic anhydride functional group, and a photoresist composition containing a polymer and a photosensitive acid generator, which polymer comprises a (meth)acrylic tert-butyl ester group, a maleic anhydride functional group, and an allyltrimethylsilane group.

These compositions have satisfactory transparency to deep UV light and have high sensitivity and definition, but their DOF properties must be further improved. Specifically, demands have been made to broaden acceptable DOF ranges in the formation of a hole pattern with a hole diameter of not more than 0.35 $\mu$m.

Japanese Patent Laid-Open No. 11-212265 (Reference 2) discloses a photoresist composition comprising a polymer and a photosensitive acid generator, which polymer contains a repeating unit represented by Formula (III) and a repeating unit represented by Formula (VII): wherein $R^1$ is a hydrogen atom or a methyl group; and $R^2$ is an alkyl group having from 1 to 4 carbon atoms.

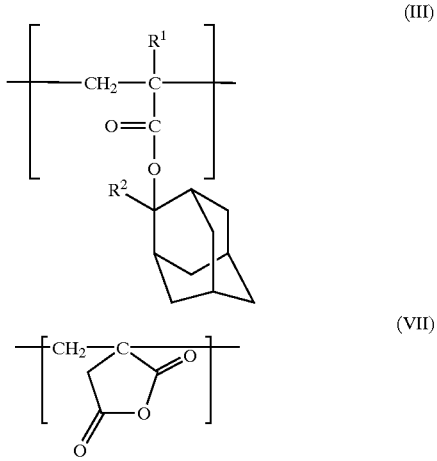

This composition has satisfactory transparency to deep UV light and has high sensitivity and definition, but its DOF properties must be further improved. Specifically, demands have been made to broaden acceptable DOF ranges in the formation of a hole pattern with a hole diameter of not more than 0.35 $\mu$m.

As a possible means to form an ultrafine resist pattern of not more than 0.35 $\mu$m, and specifically of not more than 0.25 $\mu$m, a process using a silylation agent is reported in, for example, Microelectronic Engineering 11 (1990) 531–534 (Reference 3).

As is described in Reference 3, the process for the formation of a resist pattern with a high aspect ratio using a silylation agent is performed substantially in the following manner.

Initially, a resist film (bottom resist) is formed on a substrate, and this bottom resist is resistant to etching for the substrate. Another resist film is then formed on the bottom resist, using a photoresist composition containing, for example, a polymer having a repeating unit represented by Formula (V) below, and the formed resist film is selectively patterned by exposure and developing to thereby form a resist pattern.

Next, a solution of, for example, a compound represented by Formula (VIII) below (silylation agent) is applied onto the resist pattern and is then rinsed to thereby form a silylation coating on the resist pattern, and the resulting silylation coating is resistant to corrosion induced by oxygen plasma etching.

The underlying bottom resist is removed by etching using, as a mask, the patterned resist carrying the silylation coating to thereby form a resist pattern with a high aspect ratio.

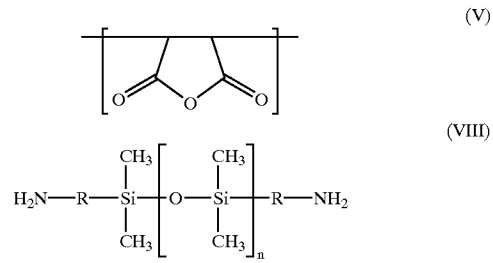

Such resist compositions that can be applied to this process must react with a silylation agent to thereby form a silylation coating and must have satisfactory DOF properties in addition to high sensitivity and definition.

SUMMARY OF THE INVENTION

Accordingly, an object of the present invention is to provide a chemically amplified photoresist composition that has satisfactory transparency, high sensitivity and definition and exhibits satisfactory DOF properties in the field of photolithography using a deep UV light source such as KrF or ArF laser, and to provide a novel copolymer that is suitable for the preparation of the photoresist composition.

Another object of the present invention is to provide a chemically amplified photoresist composition that is suitable for a process for the formation of a resist pattern with a high aspect ratio using a silylation agent, and to provide a process for the formation of a resist pattern with a high aspect ratio.

After intensive investigations, the present inventors have found that the above objects can be achieved by the use of novel copolymers having specific repeating units.

Specifically, the present invention provides, in an aspect, a novel copolymer including a repeating unit (A) represented by Formula (I) below; and a repeating unit (B) derived from an unsaturated carboxylic anhydride:

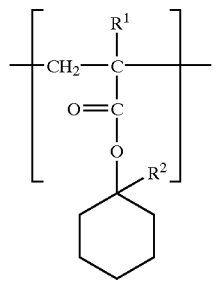

(I)

wherein $R^1$ is a hydrogen atom or a methyl group; and $R^2$ is an alkyl group having from 1 to 4 carbon atoms.

The novel copolymer preferably further includes a repeating unit (C) represented by Formula (II):

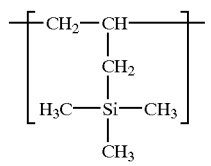

(II)

The novel copolymer preferably further includes a repeating unit (D) represented by Formula (III):

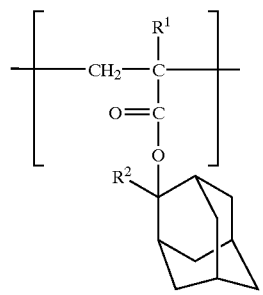

(III)

wherein $R^1$ and $R^2$ have the same meanings as defined above.

The repeating unit (A) in the novel copolymer is preferably a unit (A-1) represented by Formula (IV):

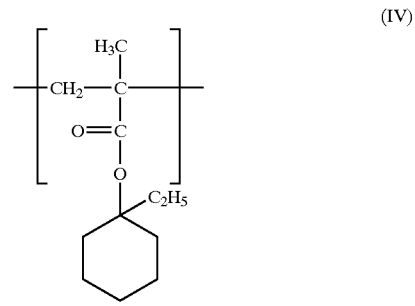

(IV)

The repeating unit (B) in the novel copolymer is preferably a repeating unit (B-1) derived from an unsaturated cyclic carboxylic anhydride.

The repeating unit (B-1) is preferably a unit (B-2) represented by Formula (V):

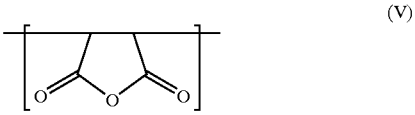

(V)

Preferably, the repeating unit (D) in the novel copolymer is a unit (D-1) represented by Formula (VI):

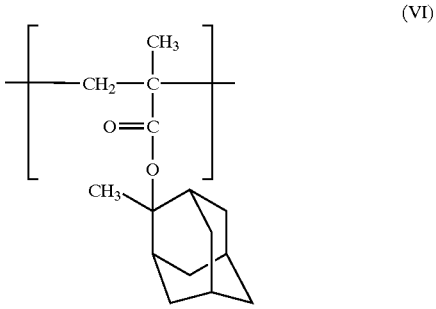

(VI)

The content of the repeating unit (A) in the novel copolymer is preferably more than 0% and less than or equal to 40% of all repeating units constituting the novel copolymer.

The content of the repeating unit (B) in the novel copolymer is preferably equal to or more than 15% and less than or equal to 60% of all repeating units constituting the novel copolymer.

The content of the repeating unit (C), if any, in the novel copolymer is preferably equal to or more than 10% and less than or equal to 40% of all repeating units constituting the novel copolymer.

The content of the repeating unit (D), if any, in the novel copolymer is preferably more than 0% and less than or equal to 40% of all repeating units constituting the novel copolymer.

The novel copolymer preferably has a weight average molecular weight (Mw) in terms of polystyrene of from 7000 to 30000 and a molecular-weight distribution (Mw/Mn, where Mn is a number average molecular weight) of less than or equal to 3.5.

In another aspect, the present invention provides a photoresist composition including the novel copolymer, a photosensitive acid generator, and an organic solvent.

In the photoresist composition, the photosensitive acid generator is preferably a triphenylsulfonium-based onium salt.

The organic solvent is preferably propylene glycol monomethyl ether acetate (PGMEA).

In addition and advantageously, the present invention provides a process for forming a resist pattern with a high aspect ratio, which process includes the steps of (a) applying a first resist on a substrate and drying the applied first resist to thereby form a first resist layer, applying the photoresist composition onto the first resist layer and drying the applied photoresist composition to thereby form a second resist layer; (b) exposing the second resist layer to imaging radiation, subjecting the exposed second resist layer to a heat treatment, and dissolving and removing exposed portions or unexposed portions of the second resist layer by developing in an alkaline aqueous solution to thereby form a resist pattern; (c) applying a silylation agent onto the formed resist pattern and rinsing the resist pattern to thereby enlarge the resist pattern and to form a silylation coating on the resist pattern, which silylation coating is resistant to corrosion induced by oxygen-containing plasma etching; and (d) etching the underlying first resist layer with oxygen-containing plasma by using, as a mask, the enlarged resist pattern carrying the silylation coating.

DESCRIPTION OF THE PREFERRED EMBODIMENTS

[Novel Copolymers]

Figure 1:
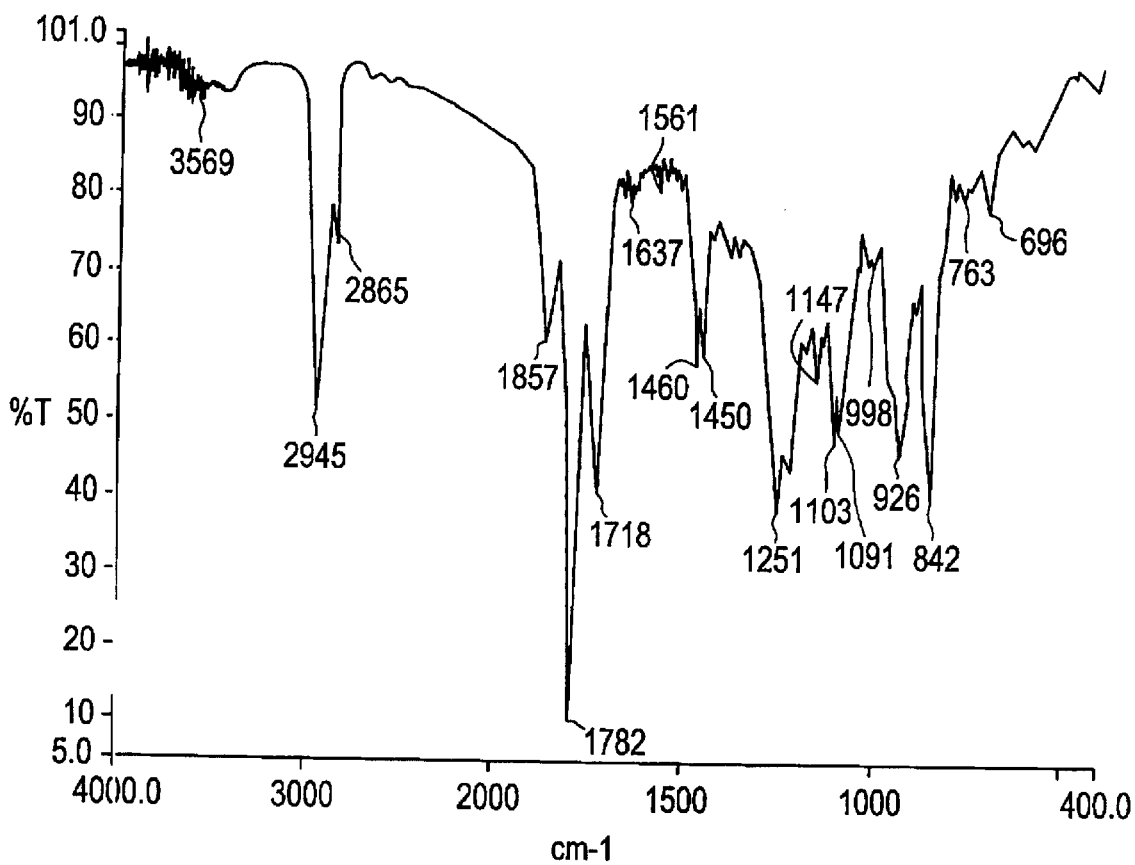
FIG. 1 is a diagram showing the spectrum of Copolymer 1 obtained in Synthesis Example 1, measured by Fourier transform infrared spectrophotometer (FT-IR)

Novel copolymers of the present invention can be synthetically obtained by a known polymerization reaction using specific comonomers. Repeating units (A), (B), (C) and (D) (hereinafter briefly referred to as "Ingredients (A), (B), (C) and (D)") will be illustrated in further detail below, as constitutional comonomers for the preparation of the novel copolymers.

[Ingredient (A)]

Ingredient (A) constituting the copolymers of the present invention is a repeating unit represented by Formula (I), which has an 1-alkyl-1-cyclohexyl group as an acid-decomposable group and is satisfactory in transparency to deep UV light such as KrF or ArF laser light. The substituent $R^1$ in the formula is a hydrogen atom or a methyl group, and $R^2$ is an alkyl group having from 1 to 4 carbon atoms. The resulting photoresist composition prepared by using a copolymer containing Ingredient (A) is satisfactory in DOF properties.

Comonomers corresponding to Ingredient (A) include 1-methyl-1-cyclohexyl acrylate, 1-methyl-1-cyclohexyl methacrylate, 1-ethyl-1-cyclohexyl acrylate, 1-ethyl-1-cyclohexyl methacrylate, 1-propyl-1-cyclohexyl acrylate, 1-propyl-1-cyclohexyl methacrylate, 1-butyl-1-cyclohexyl acrylate, and 1-butyl-1-cyclohexyl methacrylate. Among these comonomers, 1-ethyl-1-cyclohexyl methacrylate is typically preferred, since the resulting photoresist composition exhibits higher sensitivity and definition and more improved DOF properties. These comonomers corresponding to Ingredient (A) can be prepared, for example, by an esterification reaction of an 1-alkyl-1-hydroxycyclohexane with acryloyl chloride or methacryloyl chloride (Japanese Patent Application No. 11-343432).

[Ingredient (B)]

Ingredient (B) constituting the copolymers of the present invention is a repeating unit derived from an unsaturated carboxylic anhydride and is an essential unit, since the repeating unit serves to react with a silylation agent (e.g., a siloxane polymer having an amino group) to thereby form a silylation coating in the process using the silylation agent.

Comonomers corresponding to Ingredient (B) are not specifically limited and include, for example, unsaturated carboxylic anhydrides described in Japanese Patent Laid-Open Nos. 2-282746, 2-308255, 2-308256, 5-9231, 5-11450, 5-11456, and 11-212265. Such unsaturated carboxylic anhydrides include, for example, compounds represented by Formulae (IX) and (X) below, and other unsaturated acyclic carboxylic anhydrides; and compounds represented by Formulae (XI), (XII), (XIII), and (XIV) below, and other unsaturated cyclic carboxylic anhydrides:

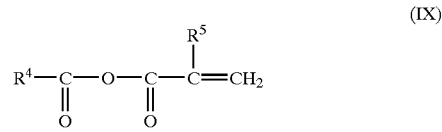
(IX)

wherein $R^4$ is an alkyl group having from 1 to 5 carbon atoms or an aryl group; and $R^5$ is a hydrogen atom or an alkyl group having from 1 to 4 carbon atoms,

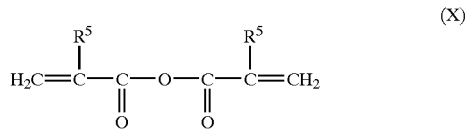
(X)

wherein each of $R^5$ and $R^6$ is independently a hydrogen atom or an alkyl group having from 1 to 4 carbon atoms,

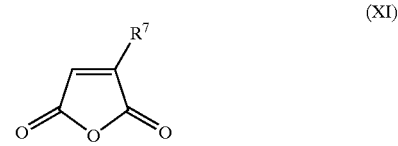
(XI)

wherein $R^7$ is a hydrogen atom or an alkyl group having from 1 to 4 carbon atoms,

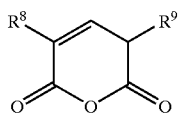

wherein each of $R^8$ and $R^9$ is independently a hydrogen atom or alkyl group having from 1 to 4 carbon atoms,

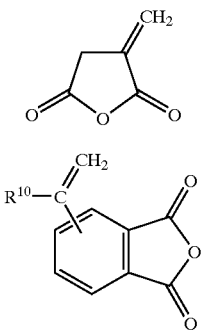

wherein $R^{10}$ is a hydrogen atom or an alkyl group having from 1 to 4 carbon atoms.

Among these comonomers, maleic anhydride is typically preferable for its high reactivity with a silylation agent and satisfactory transparency to deep UV light such as KrF or ArF laser light. The repeating unit (B-2) represented by Formula (V) is therefore preferable as Ingredient (B) for use in the copolymers of the present invention.

[Ingredient (C)]

Ingredient (C) constituting the copolymers of the present invention is a repeating unit represented by Formula (II) and serves to enhance reactivity with a silylation agent (e.g., a siloxane polymer having an amino group) in the process using the silylation agent and is preferably contained in the copolymer.

A comonomer corresponding to Ingredient (C) is allyltrimethylsilane.

[Ingredient (D)]

Ingredient (D) for use in the copolymers of the present invention is a repeating unit represented by Formula (III), which has an 2-alkyl-2-adamantyl group as an acid-decomposable group and is satisfactory in transparency to deep UV light such as KrF or ArF laser light. The substituent $R^1$ in the formula is a hydrogen atom or a methyl group, and $R^2$ is an alkyl group having from 1 to 4 carbon atoms. The resulting photoresist composition prepared by using a copolymer containing Ingredient (D) has further improved sensitivity and definition and is preferable.

Comonomers corresponding to Ingredient (D) include, for example, 2-methyl-2-adamantyl acrylate, 2-ethyl-2-adamantyl acrylate, 2-propyl-2-adamantyl acrylate, 2-butyl-2-adamantyl acrylate, 2-methyl-2-adamantyl methacrylate, 2-ethyl-2-adamantyl methacrylate, 2-propyl-2-adamantyl methacrylate, and 2-butyl-2-adamantyl methacrylate. Among them, 2-methyl-2-adamantyl methacrylate is typically preferred to yield higher sensitivity and definition of the resulting photoresist composition. These comonomers corresponding to Ingredient (D) can be synthetically obtained by known processes as described in, for example, Japanese Patent Laid-Open No. 11-212265. For example, these comonomers can be obtained by an esterification reaction of an 2-alkyl-2-adamantanol with acryloyl chloride or methacryloyl chloride.

[Contents of Ingredients (A), (B), (C) and (D)]

The novel copolymer of the present invention essentially comprises Ingredient (A), and the content of Ingredient (A) is preferably more than 0% and less than or equal to 40%, and more preferably equal to or more than 10% and less than or equal to 30%, of all the repeating units constituting the novel copolymer.

If the content of Ingredient (A) is 0%, the resulting photoresist composition is insufficient in DOF properties, and if it exceeds 40%, sensitivity and reactivity with the silylation agent may be insufficient.

The content of Ingredient (B) preferably falls within a range from 15% to 60% inclusive, and more preferably from 35% to 50% inclusive, of all the repeating units constituting the novel copolymer.

If the content of Ingredient (B) is less than 15%, the reactivity with the silylation agent may be insufficient, and if it exceeds 60%, Ingredient (B) may be readily converted into a dicarboxylic acid moiety by a reaction with moisture in the air or in the photoresist film to thereby vary the composition of the copolymer.

The content of Ingredient (C) preferably falls within a range from 10% to 40% inclusive, and more preferably from 20% to 30% inclusive, of all the repeating units constituting the novel copolymer.

If the content of Ingredient (C) is less than 10%, the reactivity with the silylation agent may not be effectively enhanced. If it exceeds 40%, the definition and DOF properties may be decreased.

The content of Ingredient (D) preferably falls within a range of more than 0% and less than or equal to 40%, and more preferably equal to or more than 5% and less than or equal to 30%, of all the repeating units constituting the novel copolymer.

If the content of Ingredient (D) is 0%, the resulting photoresist composition may not have satisfactorily improved sensitivity and definition, and if it exceeds 40%, the shape of resist pattern and DOF properties may be deteriorated.

In the most preferred embodiment, the copolymer comprises all of Ingredients (A), (B), (C) and (D).

[Polymerization Reaction]

The novel copolymers of the present invention can be synthetically obtained by subjecting the individual comonomers to a polymerization reaction with a polymerization initiator.

Such polymerization initiators include, but are not limited to, those described in, for example, Japanese Patent Laid-Open Nos. 5-11450 and 11-212265, such as azobisisobutyronitrile and dimethyl-2,2-azoisobisbutyrate. Among them, azobisisobutyronitrile is typically preferred, since this compound can effectively enhance the polymerization reaction to thereby yield a copolymer having a narrow molecular-weight distribution.

An example of the production process of the novel copolymers of the present invention will be schematically illustrated below, but the invention is not limited thereto.

(Step 1)

Initially, the material comonomers, polymerization initiator, and additives are added to an organic solvent (e.g., ethyl acetate) in a reactor and are dissolved in the organic solvent by stirring at room temperature for several ten minutes.

(Step 2)

The resulting mixture is heated to a temperature from about 60° C. to about 75° C., and is stirred at this temperature for several ten hours.

(Step 3)

After the completion of stirring, heating procedure is ceased, and the reaction mixture is cooled to about 30° C. and is then added dropwise to a poor solvent such as petroleum benzine or 2-propanol with stirring to thereby precipitate a copolymer.

(step 4)

The precipitated copolymer is rinsed with several portions of, for example, petroleum benzine and is then dried in a vacuum dessicator set at several ten degrees Celsius to thereby yield a target copolymer.

The copolymer of the present invention has a weight average molecular weight (Mw) in terms of polystyrene of preferably from about 7000 to about 30000 and more preferably from about 10000 to about 20000. If the weight average molecular weight (Mw) in terms of polystyrene is less than 7000, the copolymer may have low solubility in alcohols, and if it exceeds 30000, the resulting photoresist composition may have low definition.

The copolymer has a molecular-weight distribution (Mw/Mn) of preferably less than or equal to 3.5 and more preferably less than or equal to 2.5. If the molecular-weight distribution (Mw/Mn) exceeds 3.5, the resulting photoresist composition may have insufficient definition.

[Photoresist Composition]

Photoresist compositions according to the present invention can be prepared by mixing the novel copolymer of the present invention, a photosensitive acid generator, and an organic solvent. The content of the novel copolymer is preferably from 1 to 30% by weight and more preferably from 3 to 10% by weight relative to the total weight of the photoresist composition.

[Photosensitive Acid Generator]

When the photoresist composition of the present invention is used for the formation of a resist pattern, the photosensitive acid generator liberates an acid in exposed portions in the step of exposing a photoresist film to imaging radiation. Additionally, a subsequent heat treatment permits an "acid-decomposable group" (e.g., an 1-alkyl-1-cyclohexyl group and 2-alkyl-2-adamantyl group) in the copolymer skeleton of the photoresist composition to eliminate, which acid-decomposable group is decomposed by the catalytic reaction of the acid and becomes soluble in alkali. Consequently, exposed portions of the resist film are dissolved in a developer solution, an alkaline aqueous solution, to thereby yield a resist pattern.

Photosensitive acid generators for use in the present invention include, but are not specifically limited to, those described in, for example, Japanese Patent Laid-Open Nos. 5-11450 and 11-212265, such as onium salt compounds, organohalogen compounds, sulfone compounds, and sulfonate compounds. Among them, onium salt-based photosensitive acid generators are preferred, since the resulting photoresist compositions have high sensitivity and can form a resist pattern with a good shape, of which triphenylsulfonium-based onium salts are typically preferred for high sensitivity.

Such triphenylsulfonium-based onium salts include, for example, the following compounds represented by Formulae (E-1) to (E-3):

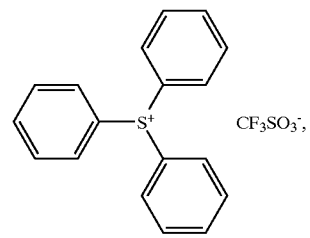

(E-1)

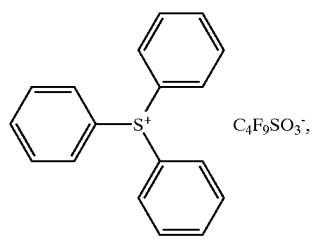

(E-2)

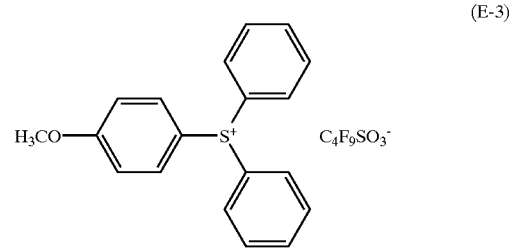

(E-3)

The amount of the photosensitive acid generator is preferably from 0.01 to 3.0% by weight and more preferably from 0.03 to 0.8% by weight based on the total weight of the composition.

[Organic Solvent]

Organic solvents for use in the present invention include, but are not specifically limited to, acetone, methyl ethyl ketone, cyclohexanone, methyl isoamyl ketone, 2-heptanone, and other ketones; ethylene glycol, propylene glycol, diethylene glycol, ethylene glycol monoacetate, propylene glycol monoacetate, diethylene glycol monoacetate, or monomethyl ethers, monoethyl ethers, monopropyl ethers, monobutyl ethers, or monophenyl ethers of these compounds, and other polyhydric alcohols and derivatives thereof; dioxane and other cyclic ethers; and ethyl lactate, methyl acetate, ethyl acetate, butyl acetate, methyl pyruvate, ethyl pyruvate, methyl methoxypropionate, ethyl ethoxypropionate, and other esters. Each of these organic solvents can be used alone or in combination.

Among these solvents, propylene glycol monomethyl ether acetate (PGMEA) is preferred, since this solvent has good coating performance, low hygroscopicity, and a high boiling point. Solvents having high hygroscopicity are not desirable, since the resulting photoresist composition takes in moisture in the air to thereby deteriorate the copolymer. Additionally, solvents having a low boiling point are also undesirable, since the amount of solvent remained in the formed photoresist film is low and the photosensitive acid generator does not efficiently diffuse in the procedure of, for example, post-exposure baking (PEB).

[Other Additives]

The photoresist compositions of the present invention may further comprise known or conventional additives according to necessity, within ranges not adversely affecting the objects of the present invention. Such additives include, for example, dissolution inhibitors, other resins, stabilizers, organic polymeric compounds, thermopolymerization inhibitors, sensitizers, improvers for adhesion to substrates, surfactants, and dyes.

The photoresist compositions of the present invention are suitable as positive photoresist compositions, but can be used as negative photoresist compositions for the formation of negative resist patterns, by incorporating acid-crosslinkable materials (substances which are crosslinked by action of an acid generated from a photosensitive acid generator) into the photoresist compositions.

The photoresist composition of the present invention is preferably used, for example, in the following manner. Initially, a solution of the (positive) photoresist composition is applied, using a spinner or the like, on a substrate such as a silicon wafer, and is then dried to thereby form a photosensitive layer; and the photosensitive layer is exposed to light through a patterned photomask.

Next, the exposed portions of the photosensitive layer are subjected to post-exposure baking (PEB) and are then dissolved and removed by dipping the substrate in a developer solution, for example, an alkaline aqueous solution such as a 1% to 10% by weight tetramethylammonium hydroxide (TMAH) aqueous solution, thus forming an image (resist pattern) being in exact accordance with the mask pattern. To further improve the definition of the resist pattern, an anti-reflection coating is preferably formed between the substrate and the photosensitive layer composed of the composition of the present invention.

[Process for Forming Resist Pattern with High Aspect Ratio]

The photoresist compositions of the present invention are specifically suitable for the process for the formation of a resist pattern using a silylation agent. In the process, adjacent resist patterns (line width) are enlarged and grooves (space width) are narrowed by using a silylation agent to thereby form a resist pattern with a high aspect ratio, and the photoresist compositions of the present invention can be advantageously used in this process. The process will be schematically illustrated below, but the invention is not limited thereto.

(Step a)

A first resist that can be smoothed is applied on a substrate and is dried to thereby form a first resist layer (herein after referred to as "bottom resist", which will be described later), and the photoresist composition of the present invention that can form a resist pattern by photolithography is applied onto the first resist layer and is dried to thereby form a second resist layer (hereinafter referred to as "top resist").

(Step b)

Subsequently, the top resist is exposed to imaging radiation and is then subjected to a heat treatment, and the exposed portions (in case of a positive photoresist composition) or unexposed portions (in case of a negative photoresist composition) of the top resist are dissolved and removed by developing in an alkaline aqueous solution to thereby form a resist pattern in exact accordance with the mask pattern.

(Step c)

Next, a silylation agent, which will be described later, is applied onto the formed resist pattern and the resist pattern is rinsed to enlarge the resist pattern (line width) and to form a silylation coating. The silylation coating is resistant to corrosion induced by oxygen-containing plasma etching.

(Step d)

The groove (space pattern) or hole (hole pattern) is narrowed by enlargement of the resist pattern carrying the silylation coating, and the bottom resist is etched with oxygen-containing plasma using the narrowed groove or hole as a mask to thereby form a resist pattern with a desired height in the bottom resist.

This process can therefore form a resist pattern with a higher aspect ratio.

[Bottom Resist]

In the above process, the bottom resist is preferably composed of a material resistant to etching of the underlying substrate, and is more preferably composed of a novolak resin. As such materials, photoresist compositions mainly containing a novolak resin and a quinonediazide are suitable. By heating the applied bottom resist on the substrate, cross-linking of the novolak resin occurs to thereby improve resistance to etching and to inhibit dissolution of the bottom resist and the top resist (the photoresist composition of the present invention) in each other.

[Silylation Agent]

Silylation agents for use in the above process are enlarging reagents that can be bonded with the resist pattern of the top resist (the photoresist composition of the present invention) and can increase the volume of the resist pattern. Additionally, the resist pattern carrying a silylation coating composed of the silylation agent can formed a layer that is very resistant to corrosion induced by dry developing in oxygen-containing plasma etching for etching the bottom resist.

Silylation agents having a Si—O (siloxane) structure are preferred as the silylation agents, since a nonvolatile oxide is formed from a silicon-containing group in the silylation coating during oxygen-containing plasma etching to thereby enhance corrosion resistance, and the siloxane compounds are highly thermally stable to thereby avoid pattern deformation during the etching operation at high temperatures. These siloxane compounds can be easily directly converted into silicon dioxide and produce little volatile organosilicon compound in oxygen-containing plasma. Among them, siloxane compounds having an amino group are preferred, such as aminosiloxane, diaminosiloxane, and bisaminopropylpolydimethylsiloxane. The amino group in the silylation agent rapidly reacts with Ingredient (B) of the copolymer in the invented photoresist composition on the surface of the resist pattern of the top resist to increase the volume of the resist pattern to thereby narrow the space pattern.

Commercially available agents can be used as the silylation agents. For example, a preferred silylation agent solution for use in the present invention is a 1% by weight bisaminopropylpolydimethylsiloxane solution prepared by dissolving bisaminopropylpolydimethylsiloxane (available from Shin-Etsu Chemical Co., Ltd., under the trade name of "X-22-161 AS") in an aqueous 1-hexanol solution.

EXAMPLES

The present invention will be illustrated in further detail with reference to several examples and comparative examples below.

The physical properties of photoresist compositions were determined according to the following methods.

(1) Sensitivity Evaluation

Initially, a novolak resin-quinonediazide positive photoresist composition (available from Tokyo Ohka Kogyo Co., Ltd., under the trade name of "THMR-iP5700") was applied on a silicon wafer, and was cured by heat to thereby form a resist film (bottom resist) 0.6 $\mu$m thick. This was used as a substrate in the subsequent procedure. A sample was applied onto the substrate using a spinner, and was dried on a hot plate at 110° C. for 90 sec. to form a resist film 0.2 $\mu$m thick. The resist film was then irradiated through a mask corresponding to a hole diameter of 0.23 μm and a duty ratio of 1:0.57 (interval between holes: 0.13 μm) using a reducing-type projection aligner NSR-S203B (available from Nikon Corporation, Japan; NA=0.60, δ=0.68) with increasing bias from 10 mJ/cm² at intervals of 1 mJ/cm². The film was then post-exposure baked (PEB) at 130° C. for 90 sec.; was subjected to developing in a 2.38% by weight tetramethylammonium hydroxide aqueous solution at 23° C. for 40 sec., was washed with water for 15 sec., and was dried. In this procedure, the sensitivity was defined as the exposure time period (Eop) (mJ/cm²) to reproduce a 0.18-μm hole pattern.

(2) Definition

The definition was defined as the minimum mask size (μm) in the critical definition to separate the bottom of the pattern at an exposure of Eop in the procedure of Evaluation (1).

(3) DOF Properties

A sample was subjected to exposure and developing in the same manner as in Evaluation (1), except that the focus was shifted up and down at an exposure of Eop as the standard exposure. The resulting hole pattern was subjected to a scanning electron micrographic (SEM) observation. Based upon the SEM photograph, the DOF property was defined as the maximum value (am) of the focal shift (defocus) to reproduce a 0.18-μm hole pattern within a variation of ±10% of the set dimension, when the hole pattern was formed under bias using a 0.23-μm mask.

Synthesis Example 1

Synthesis of Copolymer 1

To 69.4 parts by weight of ethyl acetate, 7.4 parts by weight (0.2 mole) of 1-ethyl-1-cyclohexyl methacrylate, 5.3 parts by weight (0.12 mole) of 2-methyl-2-adamantyl methacrylate, 9.9 parts by weight (0.54 mole) of maleic anhydride, 7.3 parts by weight (0.34 mole) of allyltrimethylsilane, and 0.6 part by weight of azobisisobutyronitrile were added, and were stirred at room temperature (25° C.) for 60 minutes.

Next, the resulting mixture was heated to about 70° C. and was stirred at this temperature for about 22 hours.

After the completion of stirring, the heating operation was stopped, and the reaction mixture was cooled to about 30° C. and was then added dropwise to petroleum benzine with stirring to thereby precipitate a copolymer.

The precipitated copolymer was rinsed several portions of petroleum benzine and was dried in a vacuum dessicator set at about 60° C. for 3 hours to thereby yield Copolymer 1.

Copolymer 1 was subjected to FT-IR assay by the KBr method using an FT-IR system (available from The Perkin-Elmer Corporation, under the trade name of "SPECTRUM 2000").

The results are shown in FIG. 1.

FIG. 1 shows that the characteristic absorption of the cyclohexyl moiety of 1-ethyl-1-cyclohexyl methacrylate in the vicinity of 930 cm⁻¹, the characteristic absorption of the adamantyl moiety of 2-methyl-2-adamantyl methacrylate in the vicinity of 1100 cm⁻¹, the absorption of C=O stretching vibration of maleic anhydride in the vicinity of 1780 cm⁻¹, and the absorption of the deformation vibration of Si—CH₃ of allyltrimethylsilane in the vicinity of 1250 cm⁻¹ were respectively observed.

Separately, Copolymer 1 was subjected to gel permeation chromatographic (GPC) analysis by the R.I. method using a GPC system (available from Shodex, under the trade name of "GPC-SYSTEM-11").

Figure 2:
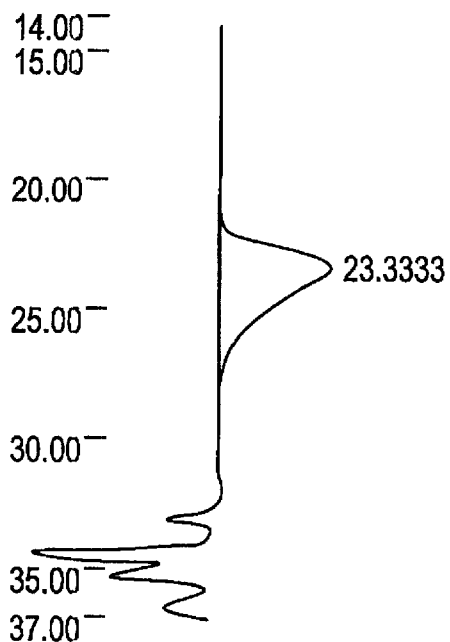
FIG. 2 is a diagram showing the chart of Copolymer 1 obtained in Synthesis Example 1, measured by gel permeation chromatography (GPC).

The results are shown in FIG. 2.

FIG. 2 shows that Copolymer 1 was a polymer having a weight average molecular weight (Mw) in terms of polystyrene of about 18400 and a molecular-weight distribution (Mw/Mn) of about 1.54.

Synthesis Examples 2 and 3

Synthesis of Copolymers 2 and 3

Copolymers 2 and 3 containing the repeating units indicated in Table 1 were synthetically obtained in the same manner as in Synthesis Example 1, except that the compositional ratios of individual comonomers were varied.

Comparative Synthesis Examples 1 and 2

Synthesis of Copolymers 4 and 5

Copolymers 4 and 5 containing the repeating units indicated in Table 1 were synthetically obtained in the same manner as in Synthesis Example 1, except that the compositional ratios of individual comonomers were varied. Copolymer 4 as a comparative example was obtained by using tert-butyl methacrylate as a comonomer. The repeating unit derived from tert-butyl methacrylate is a unit represented by Formula (X-1) below.

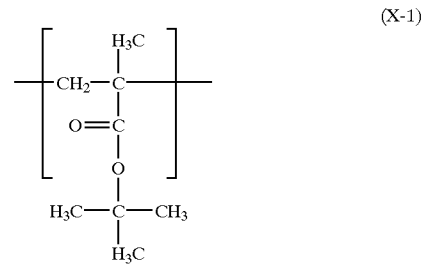

(X-1)

TABLE 1

| Example No. (Copolymer) (Mw) (Mw/Mn) | (A) (mole %) | (B) (mole %) | (C) (mole %) | (D) (mole %) | (X) (mole %) |
|---|---|---|---|---|---|
| Syn. Ex. 1 (Copolymer 1) (18400) (1.54) | A-1 (16.7) | B-2 (45) | C (28.3) | D-1 (10) | none |
| Syn. Ex. 2 (Copolymer 2) (18000) (2.0) | A-1 (40) | B-2 (60) | none | none | none |
| Syn. Ex. 3 (Copolymer 3) (18200) (1.83) | A-1 (25) | B-2 (45) | C (30) | none | none |
| Comp. Syn. Ex. 1 (Copolymer 4) (20000) (2.0) | none | B-2 (50) | C (27.5) | none | X-1 (22.5) |

TABLE 1-continued

| Example No. (Copolymer) (Mw) (Mw/Mn) | (A) (mole %) | (B) (mole %) | (C) (mole %) | (D) (mole %) | (X) (mole %) |
|---|---|---|---|---|---|
| Comp. Syn. Ex. 2 (Copolymer 5) (2000) (2.0) | none | B-2 (70) | none | D-1 (30) | none |

Examples 1 to 3 and Comparative Examples 1 and 2

Each of Copolymers 1 to 5 synthetically obtained in Synthesis Examples 1 to 3 and Comparative Synthesis Examples 1 and 2 was dissolved in PGMEA to thereby yield a 7% by weight polymer solution.

In 30 g of the above-prepared polymer solution, 0.158 g of a triphenylsulfonium-based onium salt represented by Formula (E-3) below was dissolved, and the resulting solution was filtrated though a membrane filter of 0.1 to 0.2 μm pore size to thereby yield a series of photoresist compositions.

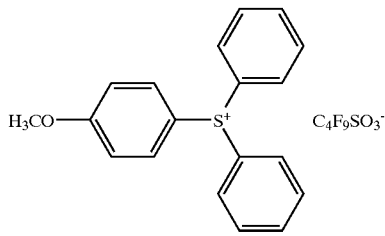

(E-3)

Evaluations (1) to (3) were conducted on the photoresist compositions prepared according to Examples 1 to 3 and Comparative Examples 1 and 2, and the results are shown in Table 2.

TABLE 2

| | Sensitivity (mJ/cm$^2$) | Definition (μm) | DOF property (μm) |
|---|---|---|---|
| Example 1 | 60 | 0.17 | 0.5 |
| Example 2 | 70 | 0.18 | 0.5 |
| Example 3 | 65 | 0.17 | 0.5 |
| Comp. Ex. 1 | 40 | 0.18 | 0.1 |
| Comp. Ex. 2 | 80 | 0.18 | 0.1 |

Synthesis Example 4

Preparation of a Silylation Agent Solution

Bisaminopropylpolydimethylsiloxane (available from Shin-Etsu Chemical Co., Ltd., under the trade name of "X-22-161 AS") was dissolved in a 98.5% by weight 1-hexanol aqueous solution to thereby yield a 1% by weight silylation agent solution.

Example 4

Formation of a Resist Pattern with a High Aspect Ratio Using the Silylation Agent A hole pattern [a hole pattern obtained within a variation of ±10% of the set hole width, 0.18 μm] was formed on a substrate in the same manner as in Evaluation (3) in Example 1, and the above-prepared silylation agent solution was carefully placed as a heap on the substrate carrying the hole pattern, and was allowed to stand for 30 seconds, and the substrate was rinsed with isopropanol for 15 seconds.

The cross section (profile) of the resist pattern after the silylation was subjected to SEM photographic observation and was found that the initial hole diameter, 0.18 μm, was narrowed to 0.14 μm by the formation of a silylation coating.

Additionally, the formation of silylation coating did not significantly adversely affect the shape (profile) of the hole pattern, and the photoresist composition exhibited DOF property of 0.5 μm, equal to that before the formation of the silylation coating.

Comparative Example 3

Formation of a Resist Pattern with a High Aspect Ratio Using the Silylation Agent A hole pattern [a hole pattern obtained within a variation of ±10% of the set hole width, 0.18 μm] was formed on a substrate in the same manner as in Evaluation (3) in Comparative Example 1, and the above-prepared silylation agent solution was carefully placed as a heap on the substrate carrying the hole pattern, and was allowed to stand for 30 seconds, and the substrate was rinsed with isopropanol for 15 seconds.

The cross section (profile) of the resist pattern after the silylation was subjected to SEM photographic observation and was found that the initial hole diameter, 0.18 μm, was narrowed to 0.15 μm by the formation of the silylation coating but that the hole profile was deteriorated.

Comparative Example 4

Formation of a Resist Pattern with a High Aspect Ratio Using the Silylation Agent A hole pattern [a hole pattern obtained within a variation of ±10% of the set hole width, 0.18 μm] was formed on a substrate in the same manner as in Evaluation (3) in Comparative Example 2, and the above-prepared silylation agent solution was carefully placed as a heap on the substrate carrying the hole pattern, and was allowed to stand for 30 seconds, and the substrate was rinsed with isopropanol for 15 seconds.

The cross section (profile) of the resist pattern after the silylation was subjected to SEM photographic observation and was found that no silylation coating was formed and that the hole diameter was not narrowed.

The present invention provides a chemically amplified photoresist composition that has satisfactory transparency, high sensitivity and definition and exhibits satisfactory DOF properties in the field of photolithography using a deep UV light source such as KrF or ArF laser, and provides a novel copolymer that is suitable for the preparation of the photoresist composition.

Additionally, the present invention provides a chemically amplified photoresist composition that is suitable for a process for the formation of a resist pattern with a high aspect ratio using a silylation agent, and provides a process for the formation of a resist pattern with a high aspect ratio.

Other embodiments and variations will be obvious to those skilled in the art, and this invention is not to be limited to the specific matters stated above.

What is claimed is:

1. A novel copolymer comprising:
   a repeating unit (A) represented by Formula (I) below; and
   a repeating unit (B) derived from an unsaturated carboxylic anhydride:

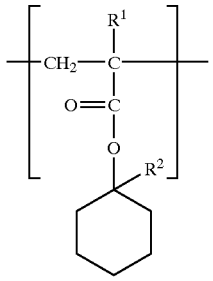
(I)

wherein $R^1$ is a hydrogen atom or a methyl group; and $R^2$ is an alkyl group having from 1 to 4 carbon atoms.

2. A novel copolymer according to claim 1, further comprising a repeating unit (C) represented by Formula (II):

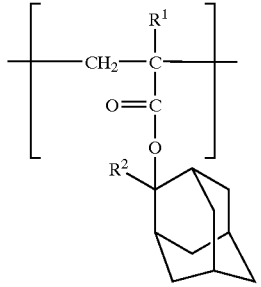
(II)

3. A novel copolymer according to claim 1, further comprising a repeating unit (D) represented by Formula (III):

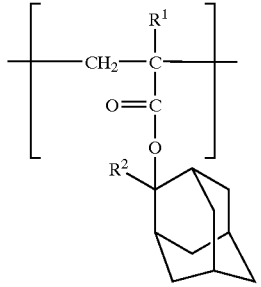
(III)

4. A novel copolymer according to claim 3, wherein said repeating unit (D) is a unit (D-1) represented by Formula (VI):

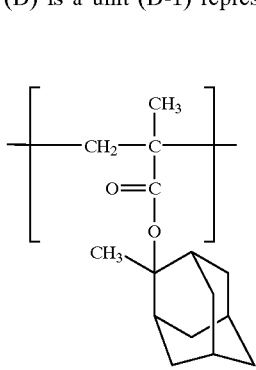
(VI)

5. A novel copolymer according to claim 3, wherein the content of said repeating unit (D) is more than 0% and less than or equal to 40% of all repeating units constituting the novel copolymer.

6. A novel copolymer according to claim 2, wherein the content of said repeating unit (C) is equal to or more than 10% and less than or equal to 40% of all repeating units constituting the novel copolymer.

7. A novel copolymer according to claim 1, wherein said repeating unit (A) is a unit (A-1) represented by Formula (IV):

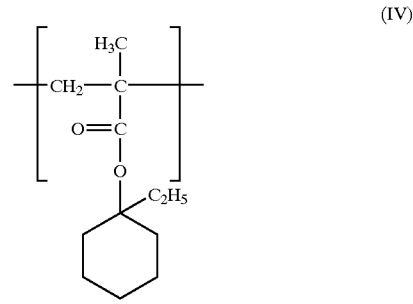
(IV)

8. A novel copolymer according to claim 1, wherein said repeating unit (B) is a repeating unit (B-1) derived from an unsaturated cyclic carboxylic anhydride.

9. A novel copolymer according to claim 8, wherein said repeating unit (B-1) is a unit (B-2) represented by Formula (V):

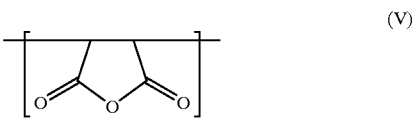
(V)

10. A novel copolymer according to claim 1, wherein the content of said repeating unit (A) is more than 0% and less than or equal to 40% of all repeating units constituting the novel copolymer.

11. A novel copolymer according to claim 1, wherein the content of said repeating unit (B) is equal to or more than 15% and less than or equal to 60% of all repeating units constituting the novel copolymer.

12. A novel copolymer according to claim 1, wherein said novel copolymer has a weight average molecular weight (Mw) in terms of polystyrene of from 7000 to 30000 and a molecular-weight distribution (Mw/Mn, where Mn is a number average molecular weight) of less than or equal to 3.5.

13. A photoresist composition comprising:
    a novel copolymer of claim 1;
    a photosensitive acid generator; and
    an organic solvent.

14. A photoresist composition according to claim 13, wherein said photosensitive acid generator is a triphenylsulfonium-based onium salt.

15. A photoresist composition according to claim 13, wherein said organic solvent is propylene glycol monomethyl ether acetate (PGMEA).

16. A process for forming a resist pattern with a high aspect ratio, said process comprising the steps of:
    (a) applying a first resist on a substrate and drying the applied first resist to thereby form a first resist layer, applying a photoresist composition of claim 13 onto the first resist layer and drying the applied photoresist composition to thereby form a second resist layer;
    (b) exposing the second resist layer to imaging radiation, subjecting the exposed second resist layer to a heat treatment, and dissolving and removing exposed portions or unexposed portions of the second resist layer by developing in an alkaline aqueous solution to thereby form a resist pattern;

(c) applying a silylation agent onto the formed resist pattern, rinsing the applied resist pattern to thereby enlarge the resist pattern and to form a silylation coating on the resist pattern, said silylation coating being resistant to corrosion induced by oxygen-containing plasma etching; and (d) etching the underlying first resist layer with oxygen-containing plasma by using, as a mask, the enlarged resist pattern carrying the silylation coating.

\* \* \* \* \*